(12) United States Patent
Aoki

(10) Patent No.: US 10,720,392 B2
(45) Date of Patent: Jul. 21, 2020

(54) WIRING SUBSTRATE

(71) Applicant: SHINKO ELECTRIC INDUSTRIES CO., LTD., Nagano (JP)

(72) Inventor: Nobutaka Aoki, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/275,699

(22) Filed: Feb. 14, 2019

(65) Prior Publication Data
US 2019/0267327 A1 Aug. 29, 2019

(30) Foreign Application Priority Data

Feb. 27, 2018 (JP) ................. 2018-032840

(51) Int. Cl.
| | | |
|---|---|---|
| H01L 23/538 | (2006.01) | |
| H01L 23/00 | (2006.01) | |
| H01L 25/065 | (2006.01) | |
| H01L 25/00 | (2006.01) | |
| H01L 21/48 | (2006.01) | |
| H01L 21/56 | (2006.01) | |
| H01L 23/31 | (2006.01) | |

(52) U.S. Cl.
CPC ........ H01L 23/5389 (2013.01); H01L 21/486 (2013.01); H01L 21/4853 (2013.01); H01L 21/4857 (2013.01); H01L 21/565 (2013.01); H01L 23/3128 (2013.01); H01L 23/5383 (2013.01); H01L 23/5384 (2013.01); H01L 23/5386 (2013.01); H01L 24/19 (2013.01); H01L 24/20 (2013.01); H01L 25/0657 (2013.01); H01L 25/50 (2013.01); *H01L 2224/214* (2013.01); *H01L 2225/06517* (2013.01); *H01L 2225/06548* (2013.01); *H01L 2225/06558* (2013.01); *H01L 2225/06586* (2013.01)

(58) Field of Classification Search
CPC . H01L 23/5389; H01L 24/19; H01L 21/4857; H01L 23/3128
See application file for complete search history.

(56) References Cited

U.S. PATENT DOCUMENTS

| | | | |
|---|---|---|---|
| 9,627,309 B2 | 4/2017 | Kobayashi et al. | |
| 10,049,972 B2 | 8/2018 | Kurita | |
| 2016/0322295 A1* | 11/2016 | Kobayashi | ........ H01L 23/49838 |

FOREIGN PATENT DOCUMENTS

| | | |
|---|---|---|
| JP | 2016-096292 | 5/2016 |
| JP | 2016-207958 | 12/2016 |

* cited by examiner

*Primary Examiner* — Changhyun Yi
(74) *Attorney, Agent, or Firm* — IPUSA, PLLC

(57) ABSTRACT

A wiring substrate includes a first insulating layer including a cavity, an electronic component in the cavity, and a second insulating layer on the first insulating layer. The second insulating layer covers the electronic component. A recess having a predetermined volume distribution is formed in an outermost layer of the electronic component that defines a surface of the electronic component facing away from the bottom of the cavity. The width of the gap between the side surface of the electronic component and the inner wall surface of the cavity in a plan view is determined based on the predetermined volume distribution. The second insulating layer is in the recess and the gap.

5 Claims, 8 Drawing Sheets

WIRING SUBSTRATE

CROSS-REFERENCE TO RELATED APPLICATION

This application is based upon and claims the benefit of priority of the prior Japanese Patent Application No. 2018-032840, filed on Feb. 27, 2018, the entire contents of which are incorporated herein by reference.

FIELD

A certain aspect of the embodiment discussed herein is related to wiring substrates.

BACKGROUND

Conventionally, a wiring substrate in which an electronic component is installed in a cavity of a first insulating layer is known. Such a wiring substrate includes, for example, a second insulating layer formed on the first insulating layer to cover the electronic component and a wiring pattern formed on an upper surface of the second insulating layer. The wiring pattern is electrically connected to a pad of the electronic component via a via hole formed in the second insulating layer. See, for example, Japanese Laid-open Patent Publication Nos. 2016-096292 and 2016-207958 for related art.

SUMMARY

According to an aspect of the present invention, a wiring substrate includes a first insulating layer including a cavity, an electronic component in the cavity, and a second insulating layer on the first insulating layer. The second insulating layer covers the electronic component. A recess having a predetermined volume distribution is formed in an outermost layer of the electronic component that defines a surface of the electronic component facing away from the bottom of the cavity. The width of the gap between the side surface of the electronic component and the inner wall surface of the cavity in a plan view is determined based on the predetermined volume distribution. The second insulating layer is in the recess and the gap.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
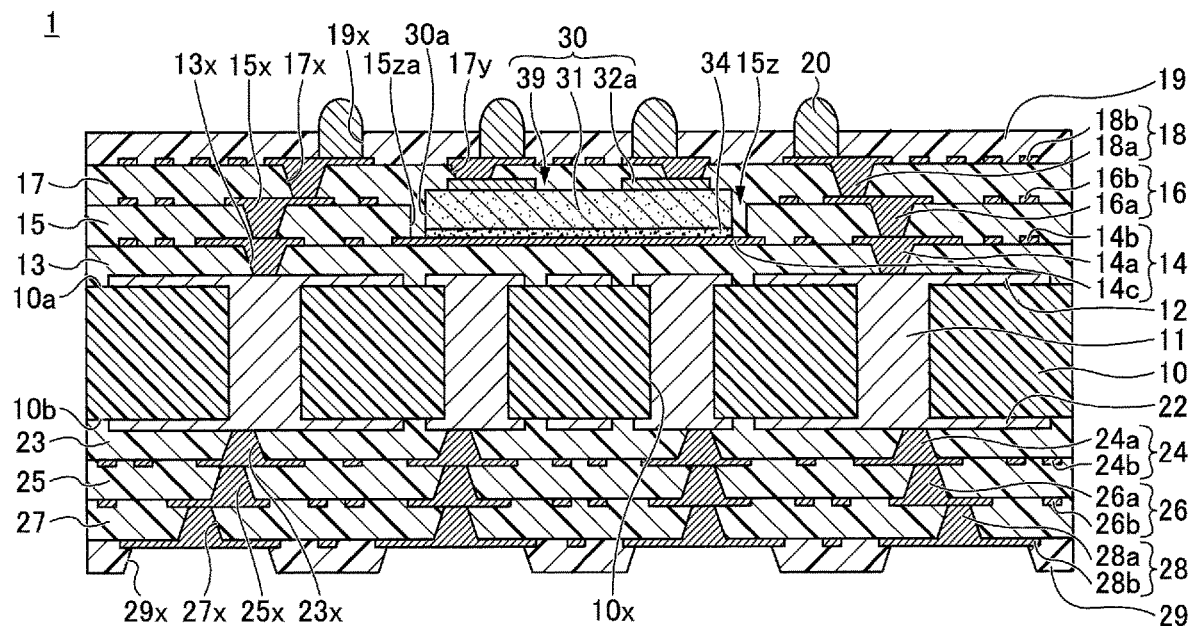
FIGS. 1A and 1B are diagrams illustrating a wiring substrate according to a first embodiment.

According to the related-art wiring substrate as described above, a wiring layer including a pad is formed at a surface of the electronic component covered with the second insulating layer, so that recesses are formed where the wiring layer is not formed. Alternatively, a protective layer covering the wiring layer is formed at a surface of the electronic component covered with the second insulating layer, and openings formed in the protective layer to expose the wiring layer (pad) become recesses. In either case, the recesses formed at the surface of the electronic component differ in volume depending on their locations.

Therefore, when forming the second insulating layer covering the electronic component with resin, more resin enters a recess having a larger volume in one area, and less resin enters a recess having a smaller volume in another area. As a result, the thickness of the second insulating layer formed on the surface of the electronic component may depend on the volume distribution of the recesses and become non-uniform.

When the second insulating layer formed on the surface of the electronic component becomes non-uniform in thickness, the depth of the via hole increases and the bottom area of the via hole (the area of the pad of the electronic component exposed at the bottom of the via hole) decreases as the thickness of the second insulating layer increases. As a result, the reliability of connection of the wiring pattern formed on the upper surface of the second insulating layer and the pad of the electronic component through the via hole decreases as the thickness of the second insulating layer increases.

According to an aspect of the present invention, in a wiring substrate in which an electronic component is installed, it is possible to improve the reliability of connection of a wiring pattern formed on an upper surface of an insulating layer covering the electronic component and a pad of the electronic component through a via hole.

A preferred embodiment of the present invention will be explained with reference to accompanying drawings. In the following, the same elements or components are referred to using the same reference numeral, and duplicate description thereof may be omitted.

[Structure of Wiring Substrate]

Figure 1B:
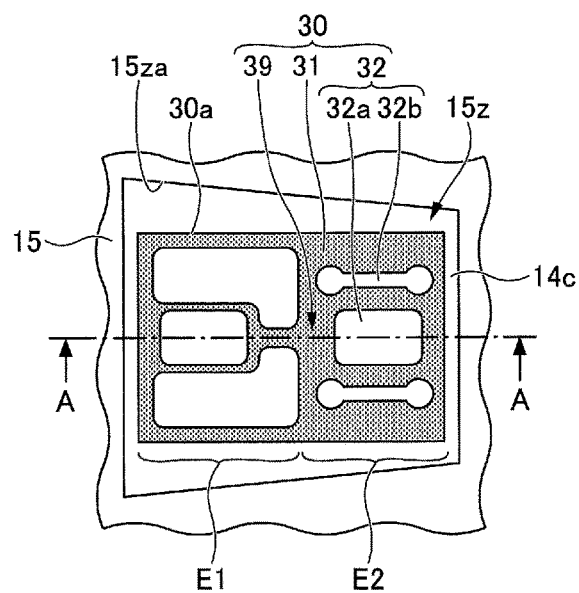

First, a structure of a wiring substrate according to an embodiment is described. FIG. 1A is a sectional view of a wiring substrate 1 according to the embodiment. FIG. 1B is a plan view of part of the wiring substrate 1, illustrating a cavity 15z and an electronic component 30. The section of the cavity 15z, the electronic component 30, and their vicinity of FIG. 1A is a section taken along the line A-A of FIG. 1B.

Referring to FIG. 1A, the wiring substrate 1 includes a core layer 10 and wiring layers and insulating layers stacked on each side of the core layer 10. The electronic component 30 is buried in the wiring substrate 1 on one side of the core layer 10.

Specifically, the wiring substrate 1 includes a wiring layer 12, an insulating layer 13, a wiring layer 14, an insulating layer 15, a wiring layer 16, an insulating layer 17, a wiring layer 18, and a solder resist layer 19, which are stacked in sequence on a first surface 10a of the core layer 10. Furthermore, the wiring substrate 1 includes a wiring layer 22, an insulating layer 23, a wiring layer 24, an insulating layer 25, a wiring layer 26, an insulating layer 27, a wiring layer 28, and a solder resist layer 29, which are stacked in sequence on a second surface 10b of the core layer 10. In FIG. 1B, a graphical representation of a structure over the electronic component 30, namely, the insulating layer 17, the wiring layer 18, the solder resist layer 19, and external connection terminals 20, is omitted.

According to this embodiment, for convenience of description, the solder resist layer 19 side of the wiring substrate 1 is referred to as "upper side" or "first side," and the solder resist layer 29 side of the wiring substrate 1 is referred to as "lower side" or "second side." Furthermore, with respect to each part or element of the wiring substrate 1, a surface on the solder resist layer 19 side is referred to as "upper surface" or "first surface," and a surface on the solder resist layer 29 side is referred to as "lower surface" or "second surface." The wiring substrate 1, however, may be used in an inverted position or oriented at any angle. Furthermore, a plan view refers to a view of an object taken in a direction normal to the first surface 10a of the core layer 10 or a surface substantially parallel to the first surface 10a, and a planar shape refers to the shape of an object viewed in a direction normal to the first surface 10a of the core layer 10 or a surface substantially parallel to the first surface 10a.

Examples of the core layer 10 include a so-called glass epoxy substrate having glass cloth impregnated with an insulating resin such as an epoxy resin and a substrate having a woven or non-woven fabric of glass fibers, carbon fibers, or aramid fibers impregnated with an epoxy resin or a polyimide resin. The thickness of the core layer 10 may be, for example, approximately 60 μm to approximately 400 μm. Through holes 10x are formed through the core layer 10 in its thickness direction. The planar shape of the through holes 10x is, for example, circular.

The wiring layer 12 is formed on the first surface 10a of the core layer 10. The wiring layer 22 is formed on the second surface 10b of the core layer 10. The wiring layer 12 and the wiring layer 22 are electrically connected by through vias 11 formed in the through holes 10x. Each of the wiring layers 12 and 22 is patterned into a predetermined planar shape. Suitable materials for the wiring layers 12 and 22 and the through vias 11 include, for example, copper (Cu). The thickness of the wiring layers 12 and 22 may be, for example, approximately 10 μm to approximately 30 μm. The wiring layer 12, the wiring layer 22, and the through vias 11 may be formed together as one piece.

The insulating layer 13 is so formed on the first surface 10a of the core layer 10 as to cover the wiring layer 12. Suitable materials for the insulating layer 13 include, for example, an insulating resin whose principal component is an epoxy resin or a polyimide resin. The thickness of the insulating layer 13 may be, for example, approximately 30 μm to approximately 40 μm. The insulating layer 13 may contain a filler such as silica ($SiO_2$). The filler content of the insulating layer 13 may be suitably determined in accordance with a required coefficient of thermal expansion (CTE).

The wiring layer 14 is formed on the insulating layer 13 on its first side. The wiring layer 14 includes via interconnects 14a filling in via holes 13x piercing through the insulating layer 13 to expose the upper surface of the wiring layer 12; a wiring pattern 14b formed on the upper surface of the insulating layer 13; and an electronic component mounting pad 14c formed on the upper surface of the insulating layer 13. The wiring pattern 14b is electrically connected to the wiring layer 12 via the via interconnects 14a. The via holes 13x may be recesses having the shape of an inverted truncated cone, having an upper-side opening at the upper surface of the insulating layer 13 and a lower-side opening on the upper surface of the wiring layer 12. The upper-side opening is greater in diameter than the lower-side opening. The material of the wiring layer 14 and the thickness of the wiring pattern 14b and the electronic component mounting pad 14c may be equal to, for example, the material and the thickness, respectively, of the wiring layer 12.

The insulating layer 15 is so formed on the upper surface of the insulating layer 13 as to cover the wiring layer 14. The insulating layer 15 may be equal in material and thickness to, for example, the insulating layer 13. The insulating layer 15 may contain a filler such as silica. The filler content of the insulating layer 15 may be equal to, for example, the filler content of the insulating layer 13.

The cavity 15z is formed in the insulating layer 15 to expose the upper surface of the electronic component mounting pad 14c. The wiring layer 16 is not formed in a region of the insulating layer 15 where the cavity 15z is formed. That is, the cavity 15z is formed in a region of the insulating layer 15 where the wiring layer 16 is not formed. The planar shape of the cavity 15z is not similar to the planar shape of the electronic component 30. A gap between a side surface 30a of the electronic component 30 and an inner wall surface (a side wall) 15za of the cavity 15z includes a relatively wide portion and a relatively narrow portion.

In the case of FIG. 1B, the planar shape of the cavity 15z is trapezoidal (an isosceles trapezoid). That is, one base of the cavity 15z faces a side of the electronic component 30 that bounds only a region E1 of the electronic component 30, the other base of the cavity 15z faces a side of the electronic component 30 that bounds only a region E2 of the electronic component 30, and the two legs of the cavity 15z face sides of the electronic component 30 that bound both regions E1 and E2 of the electronic component 30. The distance from each of the two legs of the cavity 15z to the corresponding side of the electronic component 30 that bounds both regions E1 and E2 changes along the corresponding side, increasing in a direction from the region E2 to the region E1.

The technical significance of the presence of a relatively wide portion and a relatively narrow portion in the gap between the side surface 30a of the electronic component 30 and the inner wall surface 15za of the cavity 15z is separately described.

The electronic component 30 including a body 31 and a wiring layer 32 formed on the upper surface of the body 31 is mounted on the upper surface of the electronic component mounting pad 14c exposed in the cavity 15z. The wiring layer 32 includes pads 32a and wiring patterns 32b. Examples of the electronic component 30 include a semiconductor chip, a capacitor, an inductor, and a resistor. The pads 32a and the wiring patterns 32b are formed of, for example, copper and substantially uniform in thickness.

The lower surface of the body 31 is fixed to the upper surface of the electronic component mounting pad 14c exposed in the cavity 15z via an adhesive layer 34. For example, the electronic component 30 may be mounted in the cavity 15z such that the body 31 protrudes upward relative to the upper surface of the insulating layer 15. Suitable materials for the adhesive layer 34 include, for example, an insulating adhesive agent whose principal component is an epoxy resin or a polyimide resin (for example, a die attach film).

The wiring layer 16 is formed on the insulating layer 15 on its first side. The wiring layer 16 includes via interconnects 16a filling in via holes 15x piercing through the insulating layer 15 to expose the upper surface of the wiring layer 14; and a wiring pattern 16b formed on the upper surface of the insulating layer 15. The wiring pattern 16b is electrically connected to the wiring pattern 14b via the via interconnects 16a. The via holes 15x may be recesses having the shape of an inverted truncated cone, having an upper-side opening at the upper surface of the insulating layer 15 and a lower-side opening on the upper surface of the wiring layer 14. The upper-side opening is greater in diameter than the lower-side opening. The material of the wiring layer 16 and the thickness of the wiring pattern 16b may be equal to, for example, the material and the thickness, respectively, of the wiring layer 12.

The insulating layer 17 is formed on the upper surface of the insulating layer 15, covering the electronic component 30 and the wiring layer 16. Part of the insulating layer 17 is in the gap formed between the inner wall surface 15za of the cavity 15z and the side surface 30a of the electronic component 30. For example, part of the insulating layer 17 fills in the gap formed between the inner wall surface 15za of the cavity 15z and the side surface 30a of the electronic component 30, and covers the inner wall surface 15za of the cavity 15z, the side surface 30a of the electronic component 30, and the upper surface of the electronic component mounting pad 14c. The insulating layer 17 may be equal in material and thickness to, for example, the insulating layer 13. The insulating layer 17 may contain a filler such as silica. The filler content of the insulating layer 17 may be equal to, for example, the filler content of the insulating layer 13.

The wiring layer 18 is formed on the insulating layer 17 on its first side. The wiring layer 18 includes via interconnects 18a filling in via holes 17x piercing through the insulating layer 17 to expose the upper surface of the wiring layer 16 or via holes 17y piercing through the insulating layer 17 to expose the upper surfaces of the pads 32a; and a wiring pattern 18b formed on the upper surface of the insulating layer 17. Part of the wiring pattern 18b is electrically connected to the wiring pattern 16b via the via interconnects 18a piercing through the insulating layer 17. Part of the wiring pattern 18b is electrically connected to the pads 32a via the via interconnects 18a piercing through the insulating layer 17. The via holes 17x and 17y may be recesses having the shape of an inverted truncated cone, having an upper-side opening at the upper surface of the insulating layer 17 and a lower-side opening on the upper surface of the wiring layer 16 or the upper surface of the pad 32a. The upper-side opening is greater in diameter than the lower-side opening. The material of the wiring layer 18 and the thickness of the wiring pattern 18b may be equal to, for example, the material and the thickness, respectively, of the wiring layer 12.

The solder resist layer 19 is the outermost layer of the wiring substrate 1 on its first side, and is so formed on the upper surface of the insulating layer 17 as to cover the wiring layer 18. The solder resist layer 19 may be formed of, for example, a photosensitive resin such as a photosensitive epoxy or acrylic resin. The thickness of the solder resist layer 19 may be, for example, approximately 15 μm to approximately 35 μm.

The solder resist layer 19 includes openings 19x, and the upper surface of the wiring layer 18 is partly exposed at the bottom of the openings 19x. The planar shape of the openings 19x may be, for example, circular. A metal layer may be formed or an anti-oxidation treatment such as an organic solderability preservative (OSP) process may be performed on the upper surface of the wiring layer 18 exposed in the openings 19x on an as-needed basis. Examples of metal layers include a gold (Au) layer, a Ni/Au layer (a laminated metal layer of a nickel [Ni] layer and a Au layer stacked in this order), and a Ni/Pd/Au layer (a laminated metal layer of a Ni layer, a palladium [Pd] layer, and a Au layer stacked in this order).

The external connection terminals 20 are formed on the upper surface of the wiring layer 18 exposed at the bottom of the openings 19x. The external connection terminals 20 are, for example, solder bumps. Suitable materials for solder bumps include, for example, alloys containing lead (Pb), tin-copper (Sn—Cu) alloys, tin-silver (Sn—Ag) alloys, and tin-silver-copper (Sn—Ag—Cu) alloys. The external connection terminals 20 serve as terminals for electrically connecting to a semiconductor chip.

The insulating layer 23 is so formed on the second surface 10b of the core layer 10 as to cover the wiring layer 22. The insulating layer 23 may be equal in material and thickness to, for example, the insulating layer 13. The insulating layer 23 may contain a filler such as silica. The filler content of the insulating layer 23 may be equal to, for example, the filler content of the insulating layer 13.

The wiring layer 24 is formed on the insulating layer 23 on its second side. The wiring layer 24 includes via interconnects 24a filling in via holes 23x piercing through the insulating layer 23 to expose the lower surface of the wiring layer 22; and a wiring pattern 24b formed on the lower surface of the insulating layer 23. The wiring pattern 24b is electrically connected to the wiring layer 22 via the via interconnects 24a. The via holes 23x may be recesses having the shape of a truncated cone, having an upper-side opening on the lower surface of the wiring layer 22 and a lower-side opening at the lower surface of the insulating layer 23. The lower-side opening is greater in diameter than the upper-side opening. The material of the wiring layer 24 and the thickness of the wiring pattern 24b may be equal to, for example, the material and the thickness, respectively, of the wiring layer 12.

The insulating layer 25 is so formed on the lower surface of the insulating layer 23 as to cover the wiring layer 24. The insulating layer 25 may be equal in material and thickness to, for example, the insulating layer 13. The insulating layer 25 may contain a filler such as silica. The filler content of the insulating layer 25 may be equal to, for example, the filler content of the insulating layer 13.

The wiring layer 26 is formed on the insulating layer 25 on its second side. The wiring layer 26 includes via interconnects 26a filling in via holes 25x piercing through the insulating layer 25 to expose the lower surface of the wiring layer 24; and a wiring pattern 26b formed on the lower surface of the insulating layer 25.

The wiring pattern 26b is electrically connected to the wiring layer 24 via the via interconnects 26a. The via holes 25x may be recesses having the shape of a truncated cone, having an upper-side opening on the lower surface of the wiring layer 24 and a lower-side opening at the lower surface of the insulating layer 25. The lower-side opening is greater in diameter than the upper-side opening. The material of the wiring layer 26 and the thickness of the wiring pattern 26b may be equal to, for example, the material and the thickness, respectively, of the wiring layer 12.

The insulating layer 27 is so formed on the lower surface of the insulating layer 25 as to cover the wiring layer 26. The insulating layer 27 may be equal in material and thickness to, for example, the insulating layer 13. The insulating layer 27 may contain a filler such as silica. The filler content of the insulating layer 27 may be equal to, for example, the filler content of the insulating layer 13.

The wiring layer 28 is formed on the insulating layer 27 on its second side. The wiring layer 28 includes via interconnects 28a filling in via holes 27x piercing through the insulating layer 27 to expose the lower surface of the wiring layer 26; and a wiring pattern 28b formed on the lower surface of the insulating layer 27. The wiring pattern 28b is electrically connected to the wiring layer 26 via the via interconnects 28a. The via holes 27x may be recesses having the shape of a truncated cone, having an upper-side opening on the lower surface of the wiring layer 26 and a lower-side opening at the lower surface of the insulating layer 27. The lower-side opening is greater in diameter than the upper-side opening. The material of the wiring layer 28 and the thickness of the wiring pattern 28b may be equal to, for example, the material and the thickness, respectively, of the wiring layer 12.

The solder resist layer 29 is the outermost layer of the wiring substrate 1 on its second side, and is so formed on the lower surface of the insulating layer 27 as to cover the wiring layer 28. The solder resist layer 29 may be equal in material and thickness to, for example, the solder resist layer 19. The solder resist layer 29 includes openings 29x, and the lower surface of the wiring layer 28 is partly exposed in the openings 29x. The planar shape of the openings 29x may be, for example, circular. The wiring layer 28 exposed in the openings 29x may be used as pads for electrically connecting to a mounting board such as a motherboard (not depicted). The above-described metal layer may be formed or an anti-oxidation treatment such as an OSP process may be performed on the lower surface of the wiring layer 28 exposed in the openings 29x on an as-needed basis.

[Method of Manufacturing Wiring Substrate]

Next, a method of manufacturing a wiring substrate according to the embodiment is described. FIGS. 2A through 5E are diagrams illustrating a process of manufacturing a wiring substrate according to the embodiment. Here, by way of example, a process of manufacturing a single wiring substrate is illustrated. Alternatively, however, the process may be adapted to manufacture a structure to become multiple wiring substrates and thereafter divide the structure into individual wiring substrates.

Figure 2A:
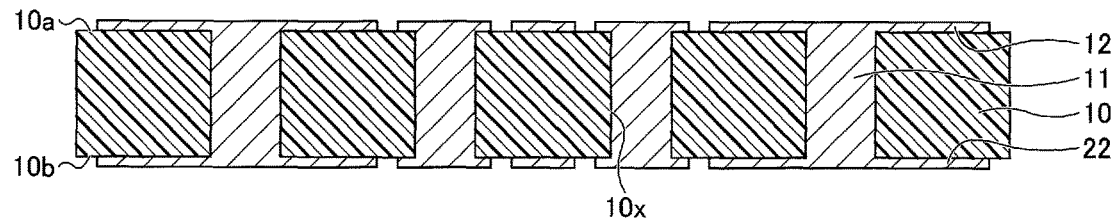
FIGS. 2A and 2B are diagrams illustrating a process of manufacturing a wiring substrate according to the first embodiment.

First, in the process depicted in FIG. 2A, the through vias 11 are formed in and the wiring layers 12 and 22 are formed on the core layer 10. Specifically, for example, a laminated board having unpatterned plain copper foil formed on each of the first surface 10a and the second surface 10b of the core layer 10, which is a so-called glass epoxy substrate, is prepared. Then, in the prepared laminated board, the copper foil on each surface is thinned on an as-needed basis, and thereafter, the through holes 10x piercing through the core layer 10 and through the copper foil on each surface are formed by, for example, laser processing using a $CO_2$ laser.

Next, a desmear process is performed on an as-needed basis to remove the residual resin of the core layer 10 adhering to the inner wall surfaces of the through holes 10x. Then, a seed layer (for example, copper) covering the copper foil on each surface and the inner wall surfaces of the through holes 10x is formed by, for example, electroless plating or sputtering, and an electroplating layer (for example, copper) is formed on the seed layer by electroplating using the seed layer as a power feed layer. As a result, the through holes 10x are filled with the electroplating layer formed on the seed layer, and the wiring layers 12 and 22, each of which is a lamination of the copper foil, the seed layer, and the electroplating layer, are formed on the first surface 10a and the second surface 10b, respectively, of the core layer 10. Next, the wiring layers 12 and 22 are patterned into a predetermined shape by, for example, a subtractive process.

Figure 2B:
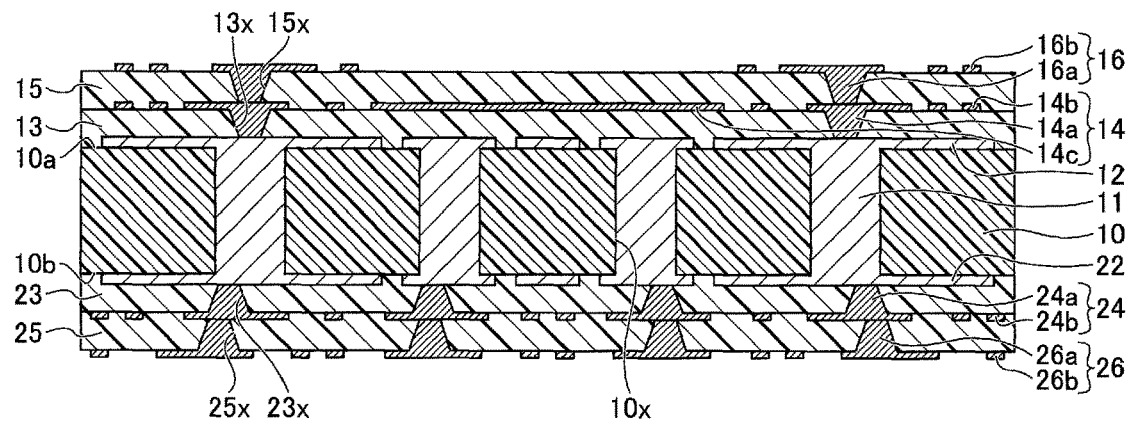

Next, in the process depicted in FIG. 2B, the first surface 10a of the core layer 10 is laminated with a semi-cured epoxy resin film such that the wiring layer 12 is covered with the semi-cured epoxy resin film, and the semi-cured epoxy resin film is cured to form the insulating layer 13. Furthermore, the second surface 10b of the core layer 10 is laminated with a semi-cured epoxy resin film such that the wiring layer 22 is covered with the semi-cured epoxy resin film, and the semi-cured epoxy resin film is cured to form the insulating layer 23. Alternatively, instead of laminating the first surface 10a and the second surface 10b with an epoxy resin film, epoxy resin liquid or paste may be applied to the first surface 10a and the second surface 10b and thereafter cured to form the insulating layers 13 and 23. Each of the insulating layers 13 and 23 may be, for example, approximately 30 μm to approximately 40 μm in thickness. Each of the insulating layers 13 and 23 may contain a filler such as silica.

Next, the via holes 13x piercing through the insulating layer 13 to expose the upper surface of the wiring layer 12 are formed in the insulating layer 13. Furthermore, the via holes 23x piercing through the insulating layer 23 to expose the lower surface of the wiring layer 22 are formed in the insulating layer 23. The via holes 13x and 23x may be formed by, for example, laser processing using a $CO_2$ laser. After formation of the via holes 13x and 23x, it is preferable to perform a desmear process to remove residual resin adhering to the surfaces of the wiring layers 12 and 22 exposed at the bottom of the via holes 13x and 23x, respectively.

Next, the wiring layer 14 is formed on the insulating layer 13 on its first side. The wiring layer 14 includes the via interconnects 14a filling in the via holes 13x, the wiring pattern 14b formed on the upper surface of the insulating layer 13, and the electronic component mounting pad 14c formed on the upper surface of the insulating layer 13. The material of the wiring layer 14 and the thickness of the wiring pattern 14b and the electronic component mounting pad 14c may be equal to, for example, the material and the thickness, respectively, of the wiring layer 12. The wiring layer 14 is electrically connected to the wiring layer 12 exposed at the bottom of the via holes 13x.

Furthermore, the wiring layer 24 is formed on the insulating layer 23 on its second side. The wiring layer 24 includes the via interconnects 24a filling in the via holes 23x and the wiring pattern 24b formed on the lower surface of the insulating layer 23. The material of the wiring layer 24 and the thickness of the wiring pattern 24b may be equal to, for example, the material and the thickness, respectively, of the wiring layer 12. The wiring layer 24 is electrically connected to the wiring layer 22 exposed at the bottom of the via holes 23x. The wiring layers 14 and 24 may be formed using a process among a variety of wiring forming processes, such as a semi-additive process or a subtractive process.

For example, in the case of forming the wiring layer 14 by a semi-additive process, the via holes 13x are formed in the insulating layer 13, and a seed layer is then formed on the surface of the insulating layer 13 including the inner wall surfaces of the via holes 13x and on the surface of the wiring layer 12 exposed in the via holes 13x by electroless plating of copper. Next, a plating resist pattern having an opening matching the shape of the wiring pattern 14b and the electronic component mounting pad 14c of the wiring layer 14 is formed on the seed layer, and an electroplating layer is deposited on the seed layer exposed in the openings of the plating resist pattern by electroplating of copper feeding power from the seed layer. Next, the plating resist pattern is removed, and etching is then performed using the electroplating layer as a mask to remove the seed layer exposed through the electroplating layer. As a result, the wiring layer 14 including the via interconnects 14a, and the wiring pattern 14b and the electronic component mounting pad 14c can be obtained.

Next, the insulating layer 15 is so formed on the upper surface of the insulating layer 13 as to cover the wiring layer 14 by the same process as the insulating layer 13. The insulating layer 15 may be equal in material and thickness to, for example, the insulating layer 13. Then, the via holes 15x are formed by the same process as the via holes 13x. Then, the wiring layer 16 is formed on the insulating layer 15 on its first side by the same process as the wiring layer 14. The wiring layer 16 includes the via interconnects 16a filling in the via holes 15x and the wiring pattern 16b formed on the upper surface of the insulating layer 15. The material of the wiring layer 16 and the thickness of the wiring pattern 16b may be equal to, for example, the material and the thickness, respectively, of the wiring layer 12. The wiring layer 16 is electrically connected to the wiring layer 14 exposed at the bottom of the via holes 15x.

Furthermore, the insulating layer 25 is so formed on the lower surface of the insulating layer 23 as to cover the wiring layer 24 by the same process as the insulating layer 13. The insulating layer 25 may be equal in material and thickness to, for example, the insulating layer 13. Then, the via holes 25x are formed by the same process as the via holes 13x. Then, the wiring layer 26 is formed on the insulating layer 25 on its second side by the same process as the wiring layer 14. The wiring layer 26 includes the via interconnects 26a filling in the via holes 25x and the wiring pattern 26b formed on the lower surface of the insulating layer 25. The material of the wiring layer 26 and the thickness of the wiring pattern 26b may be equal to, for example, the material and the thickness, respectively, of the wiring layer 12. The wiring layer 26 is electrically connected to the wiring layer 24 exposed at the bottom of the via holes 25x.

Figure 3A:
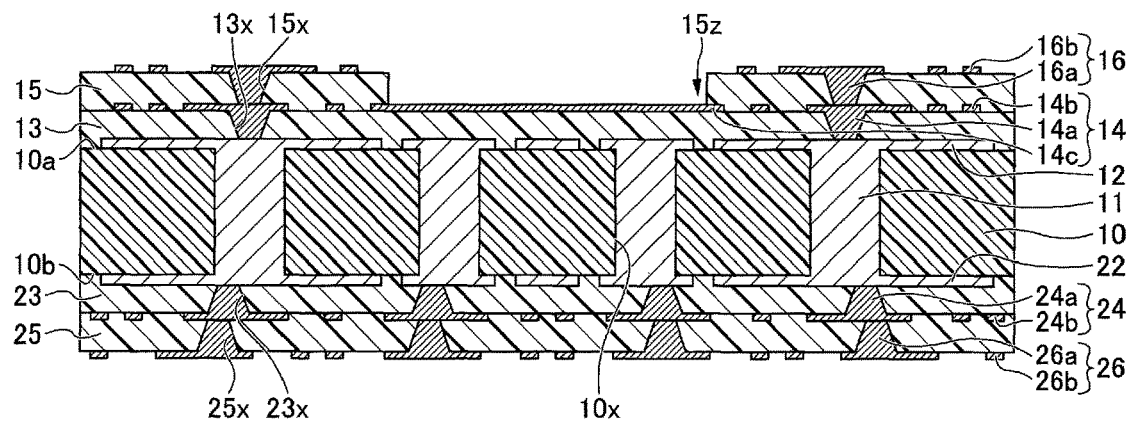
FIGS. 3A and 3B are diagrams illustrating the process of manufacturing a wiring substrate according to the first embodiment.
Figure 3B:
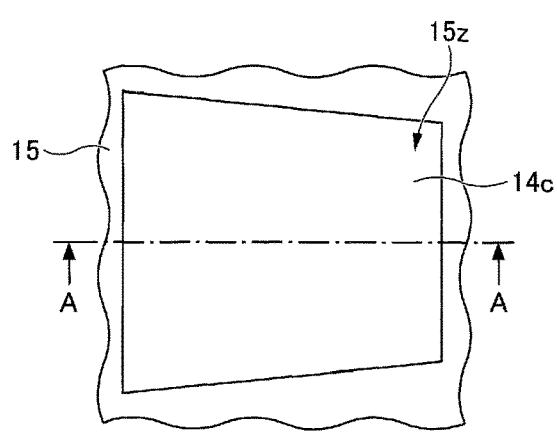

Next, in the process depicted in FIGS. 3A and 3B, the cavity 15z exposing the upper surface of the electronic component mounting pad 14c is formed in the insulating layer 15. The planar shape of the cavity 15z is so determined that the gap between the side surface 30a of the electronic component 30 to be mounted and the inner wall surface 15za of the cavity 15z is a predetermined value to make the insulating layer 17 to be formed on the electronic component 30 in a subsequent process uniform in thickness. The cavity 15z may be formed by, for example, laser processing using a $CO_2$ laser. FIG. 3A is a sectional view of a laminated structure, and FIG. 3B is a plan view of part of the laminated structure of FIG. 3A, illustrating the cavity 15z. The section of the cavity 15z and its vicinity of FIG. 3A is a section taken along the line A-A of FIG. 3B.

Figure 4A:
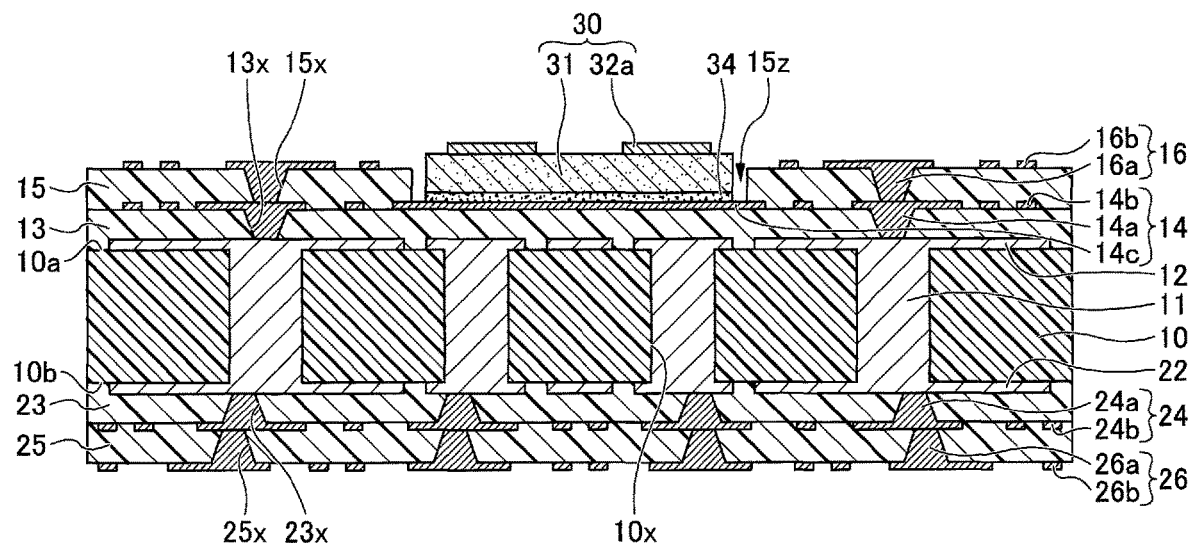
FIGS. 4A and 4B are diagrams illustrating the process of manufacturing a wiring substrate according to the first embodiment.
Figure 4B:
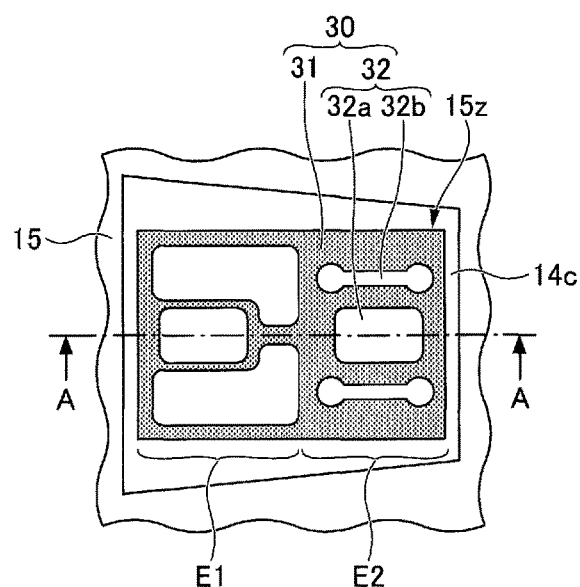

In the process depicted in FIGS. 4A and 4B, the electronic component 30 including the body 31 and the wiring layer 32 is prepared, and the electronic component 30 is placed in the cavity 15z. The adhesive layer 34 is formed in advance on the lower surface of the electronic component 30. The adhesive layer 34 may be formed on not the lower surface of the electronic component 30 but the electronic component mounting pad 14c exposed in the cavity 15z. In either case, the lower surface of the electronic component 30 is fixed onto the upper surface of the electronic component mounting pad 14c exposed in the cavity 15z via the adhesive layer 34. In the process depicted in FIGS. 4A and 4B, the adhesive layer 34 is not cured, and the electronic component 30 is temporarily fixed in the cavity 15z. FIG. 4A is a sectional view of a laminated structure, and FIG. 45 is a plan view of part of the laminated structure of FIG. 4A, illustrating the cavity 15z and the electronic component 30. The section of the cavity 15z, the electronic component 30, and their vicinity of FIG. 4A is a section taken along the line A-A of FIG. 4B.

Figure 5A:
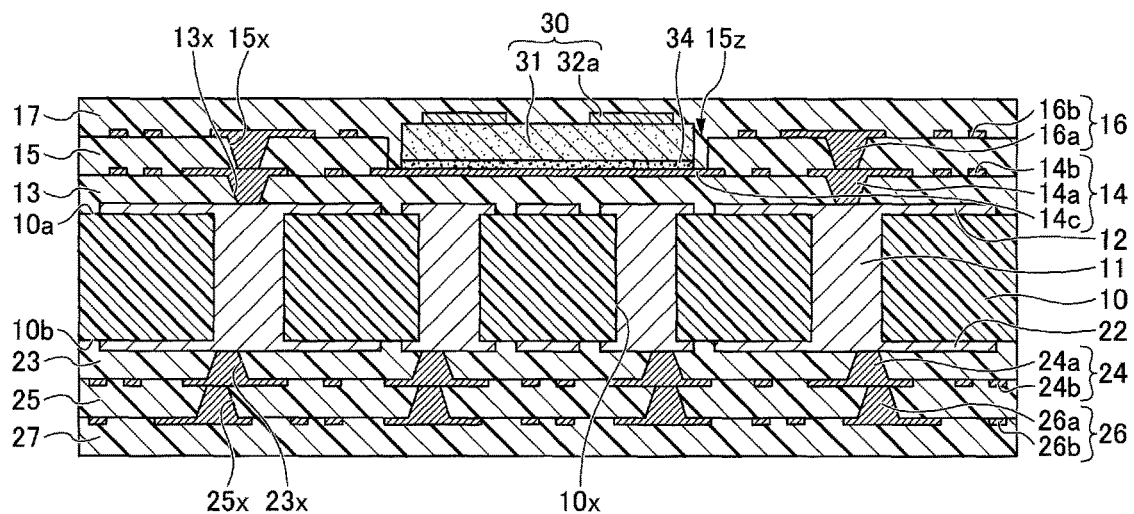
FIGS. 5A through 5E are diagrams illustrating the process of manufacturing a wiring substrate according to the first embodiment.

Next, in the process depicted in FIG. 5A, the insulating layer 17 is formed by laminating the upper surface of the insulating layer 15 with a semi-cured epoxy resin film such that the electronic component 30 and the wiring layer 16 are covered with the semi-cured epoxy resin film. Furthermore, the insulating layer 27 is formed by laminating the lower surface of the insulating layer 25 with a semi-cured epoxy resin film such that the wiring layer 26 is covered with the semi-cured epoxy resin film. Alternatively, instead of forming a lamination of a semi-cured epoxy resin film, the insulating layers 17 and 27 may be formed by applying epoxy resin liquid or paste.

Then, while heating the insulating layers 17 and 27 thus formed, the upper surface of the insulating layer 17 and the lower surface of the insulating layer 27 are pressed toward the core layer 10 with parallel plates. At this point, the adhesive layer 34 as well is heated. Therefore, the molten insulating layer 17, insulating layer 27, and adhesive layer 34 are cured substantially simultaneously. The insulating layer 17 covers the electronic component 30 and the wiring layer 16, and enters the gap between the side surface 30a of the electronic component 30 and the inner wall surface 15za of the cavity 15z. The thickness of each of the insulating layers 17 and 27 may be, for example, approximately 30 µm to approximately 40 µm. Each of the insulating layers 17 and 27 may contain a filler such as silica.

Figure 5B:
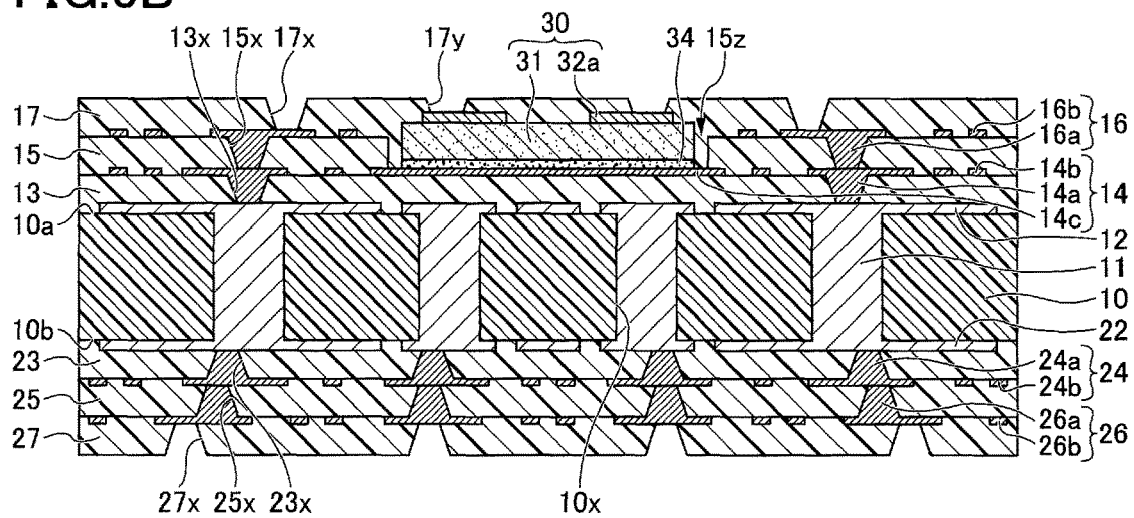

Next, in the process depicted in FIG. 5B, the via holes 17x piercing through the insulating layer 17 to expose the upper surface of the wiring layer 16 and the via holes 17y piercing through the insulating layer 17 to expose the upper surfaces of the pads 32a of the electronic component 30 are formed. Furthermore, the via holes 27x piercing through the insulating layer 27 to expose the lower surface of the wiring layer 26 are formed in the insulating layer 27. The via holes 17x, 17y, and 27x may be formed by, for example, laser processing using a $CO_2$ laser. After formation of the via holes 17x, 17y, and 27x, it is preferable to perform a desmear process to remove residual resin adhering to the surface of the wiring layer 16, the surfaces of the pads 32a, and the surface of the wiring layer 26 exposed at the bottom of the via holes 17x, 17y and 27x, respectively.

Figure 5C:
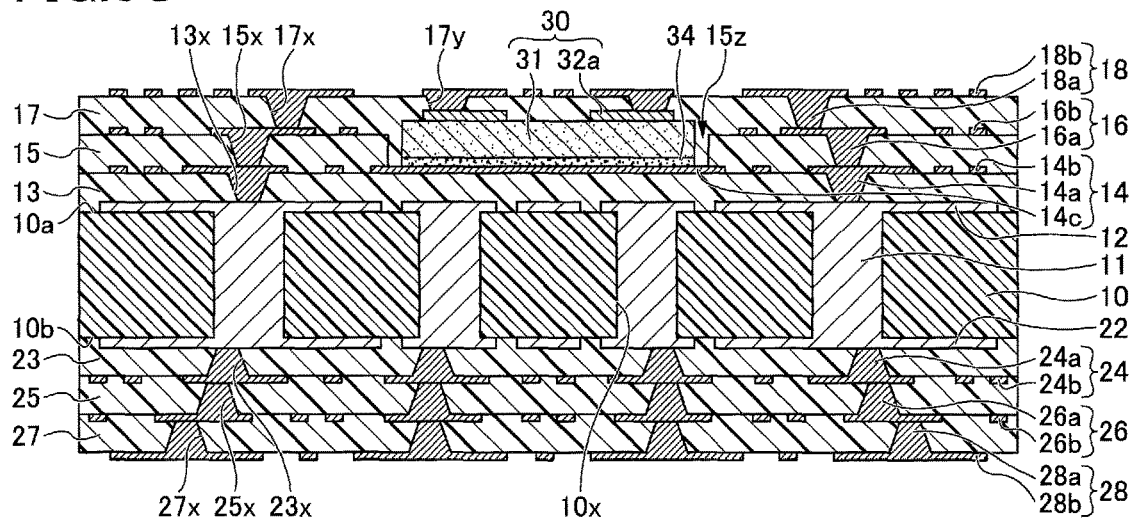

Next, in the process depicted in FIG. 5C, the wiring layer 18 is formed on the insulating layer 17 on its first side by the same process as the wiring layer 14. The wiring layer 18 includes the via interconnects 18a filling in the via holes 17x or 17*y* and the wiring pattern 18*b* formed on the upper surface of the insulating layer 17. The material of the wiring layer 18 and the thickness of the wiring pattern 18*b* may be equal to, for example, the material and the thickness, respectively, of the wiring layer 12. The wiring layer 18 is electrically connected to the wiring layer 16 exposed at the bottom of the via holes 17*x* and the pads 32*a* exposed at the bottom of the via holes 17*y*.

Furthermore, the wiring layer 28 is formed on the insulating layer 27 on its second side by the same process as the wiring layer 14. The wiring layer 28 includes the via interconnects 28*a* filling in the via holes 27*x* and the wiring pattern 28*b* formed on the lower surface of the insulating layer 27. The material of the wiring layer 28 and the thickness of the wiring pattern 28*b* may be equal to, for example, the material and the thickness, respectively, of the wiring layer 12. The wiring layer 28 is electrically connected to the wiring layer 26 exposed at the bottom of the via holes 27*x*.

Figure 5D:
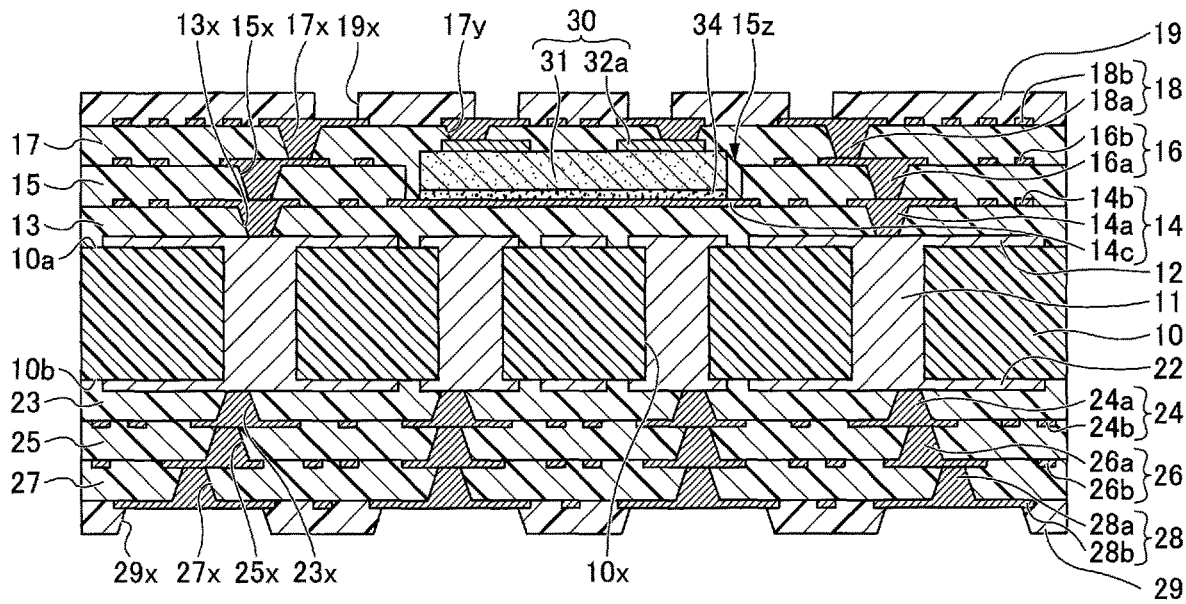

Next, in the process depicted in FIG. 5D, the solder resist layer 19 is so formed on the upper surface of the insulating layer 17 as to cover the wiring layer 18. Furthermore, the solder resist layer 29 is so formed on the lower surface of the insulating layer 27 as to cover the wiring layer 28. The solder resist layer 19 may be formed by, for example, applying a photosensitive epoxy or acrylic insulating resin in liquid or paste form onto the upper surface of the insulating layer 17 by a process such as screen printing, roll coating, or spin coating such that the wiring layer 18 is covered with the applied resin. Alternatively, the solder resist layer 19 may be formed by, for example, laminating the upper surface of the insulating layer 17 with a photosensitive epoxy or acrylic insulating resin film such that the wiring layer 18 is covered with the film. The solder resist layer 29 is formed by the same process as the solder resist layer 19.

Next, the solder resist layers 19 and 29 are exposed to light and developed to form the openings 19*x* partly exposing the upper surface of the wiring layer 18 and the openings 29*x* partly exposing the lower surface of the wiring layer 28 in the solder resist layers 19 and 29, respectively (photolithography). The openings 19*x* and 29*x* may alternatively be formed by laser processing or blasting. In this case, a photosensitive material does not have to be used for the solder resist layers 19 and 29. The planar shape of the openings 19*x* and the planar shape of the openings 29*x* may be, for example, circular. The diameter of the openings 19*x* and the diameter of the openings 29*x* may be designed as desired in accordance with connection targets (such as a semiconductor chip and a motherboard).

In this process, the above-described metal layer may be formed on the upper surface of the wiring layer 18 exposed at the bottom of the openings 19*x* and the lower surface of the wiring layer 28 exposed at the bottom of the openings 29*x* by, for example, electroless plating. Instead of forming the metal layer, it is possible to perform an anti-oxidation treatment such as an OSP process.

Figure 5E:
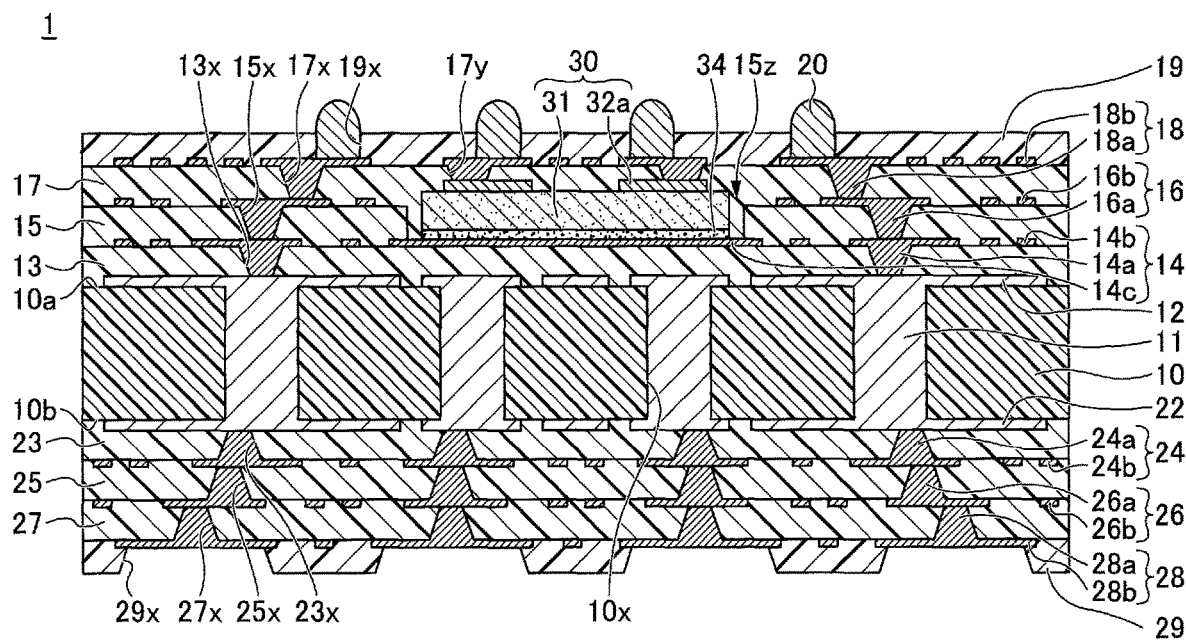

Next, in the process depicted in FIG. 5E, the external connection terminals 20 such as solder bumps are formed on the upper surface of the wiring layer 18 exposed at the bottom of the openings 19*x*. The external connection terminals 20 serve as terminals for electrically connecting to a semiconductor chip.

Here, the effect of a structure where the gap between the side surface 30*a* of the electronic component 30 and the inner wall surface 15*za* of the cavity 15*z* includes a relatively wide portion and a relatively narrow portion in a plan view is described.

The electronic component 30 includes, as the outermost layer on the insulating layer 17 side, the wiring layer 32 and a recess 39 (see FIGS. 1A and 1B) formed around the wiring layer 32. In other words, the recess 39 is a portion of the outermost layer where the wiring layer 32 is not formed. Thus, the recess 39 is formed in the outermost layer of the electronic component 30 that defines the upper surface of the electronic component 30 facing away from the bottom of the cavity 15*z*.

According to the electronic component 30, while the thickness of the wiring layer is substantially uniform, the density of the wiring layer 32 is not uniform and differs depending on a region. For example, as illustrated in FIG. 1B, the planar shape of the electronic component 30 is rectangular. In this case, for example, the surface region of the electronic component 30 having a rectangular planar shape may be equally bisected into the region E1 and the region E2. For example, referring to FIG. 1B, the density of the wiring layer 32 is relatively high in the region E1 and relatively low in the region E2 in the electronic component 30.

In other words, the recess 39 formed in the outermost layer of the electronic component 30 on the insulating layer 17 side has a predetermined volume distribution, and referring to FIG. 1B, the volume of the recess 39 is relatively small in the region E1 and relatively large in the region E2. In FIG. 1B, the bottom of the recess 39 is indicated by a dotted pattern to make it possible to visually recognize that the surface area of the bottom of the recess 39 is larger in the region E2 than in the region E1. Because the thickness of the wiring layer 32 is substantially uniform, it can be easily understood that the volume of the recess 39 is relatively small in the region E1 and relatively large in the region E2.

Here, it is assumed that the planar shape of the cavity 15*z* is similar to the planar shape of the electronic component 30 and that the gap between the side surface 30*a* of the electronic component 30 and the inner wall surface 15*za* of the cavity 15*z* is substantially uniform.

In this case, during formation of the insulating layer 17 covering the electronic component 30, a greater amount of molten resin to become the insulating layer 17 enters the recess 39 in the region E2 where the volume of the recess 39 is relatively large than in the region E1 where the volume of the recess 39 is relatively small. Therefore, the insulating layer 17 is thicker on the region E1 than on the region E2, and in this state, the resin cures into the insulating layer 17.

When the via holes 17*x* and 17*y* are formed in this state, the via holes 17*y* become deeper and the bottom area of the via holes 17*y* (the area of the pad 32*a* exposed at the bottom of the via holes 17*y*) becomes smaller as the insulating layer 17 becomes thicker. As a result, the reliability of connection of the wiring pattern 18*b* and the pads 32*a* via the via holes 17*y* is lower in the region E1 where the insulating layer 17 is thicker.

In contrast, according to the wiring substrate 1, the width of the gap between the side surface 30*a* of the electronic component 30 and the inner wall surface 15*za* of the cavity 15*z* in a plan view is determined based on the volume distribution of the recess 39.

Specifically, the cavity 15*z* is so formed that the gap between the side surface 30*a* of the electronic component 30 and the inner wall surface 15*za* of the cavity 15*z* is wider along at least part of the region E1 where the volume of the recess 39 is relatively small than along the region E2 where the volume of the recess 39 is relatively large in a plan view.

This causes a greater amount of molten resin to become the insulating layer 17 to enter the gap between the side surface 30a of the electronic component 30 and the inner wall surface 15za of the cavity 15z along the region E1 in the process of forming the insulating layer 17. Therefore, the thickness of the insulating layer 17 on the region E1 is substantially equal to the thickness of the insulating layer 17 on the region E2. In other words, the size of the gap between the side surface 30a of the electronic component 30 and the inner wall surface 15za of the cavity 15z is so determined that the thickness of the insulating layer 17 on the region E1 is substantially equal to the thickness of the insulating layer 17 on the region E2.

As a result, the depth of the via holes 17y and the bottom area of the via holes 17y (the area of the pad 32a exposed at the bottom of the via holes 17y) are substantially uniform on the regions E1 and E2. Consequently, the bottom area of the via holes 17y is prevented from being extremely small. Therefore, it is possible to increase the reliability of connection of the wiring pattern 18b and the pads 32a via the via holes 17y.

When the gap between the side surface 30a of the electronic component 30 and the inner wall surface 15za of the cavity 15z includes a relatively wide portion and a relatively narrow portion in a plan view and the thickness of the insulating layer 17 on the electronic component 30 is uniform compared with the case where the gap between the side surface 30a of the electronic component 30 and the inner wall surface 15za of the cavity 15z is relatively uniform, it can be said that "the width of the gap between the side surface 30a of the electronic component 30 and the inner wall surface 15za of the cavity 15z in a plan view is determined based on the volume distribution of the recess 39."

Furthermore, while the two divisional regions E1 and E2 are compared with respect to the volume of the recess 39 in the case of FIG. 1B, more divisional regions may be compared with respect to the volume of the recess 39 and the width of the gap between the side surface 30a of the electronic component 30 and the inner wall surface 15za of the cavity 15z may be determined based on the result of the comparison.

[First Variation of Embodiment]

A first variation of the embodiment illustrates a case where an electronic component different in shape from the electronic component 30 of the above-described embodiment is installed. In the following description of the first variation, a description of the same elements or components as those of the above-described embodiment may be omitted.

Figure 6A:
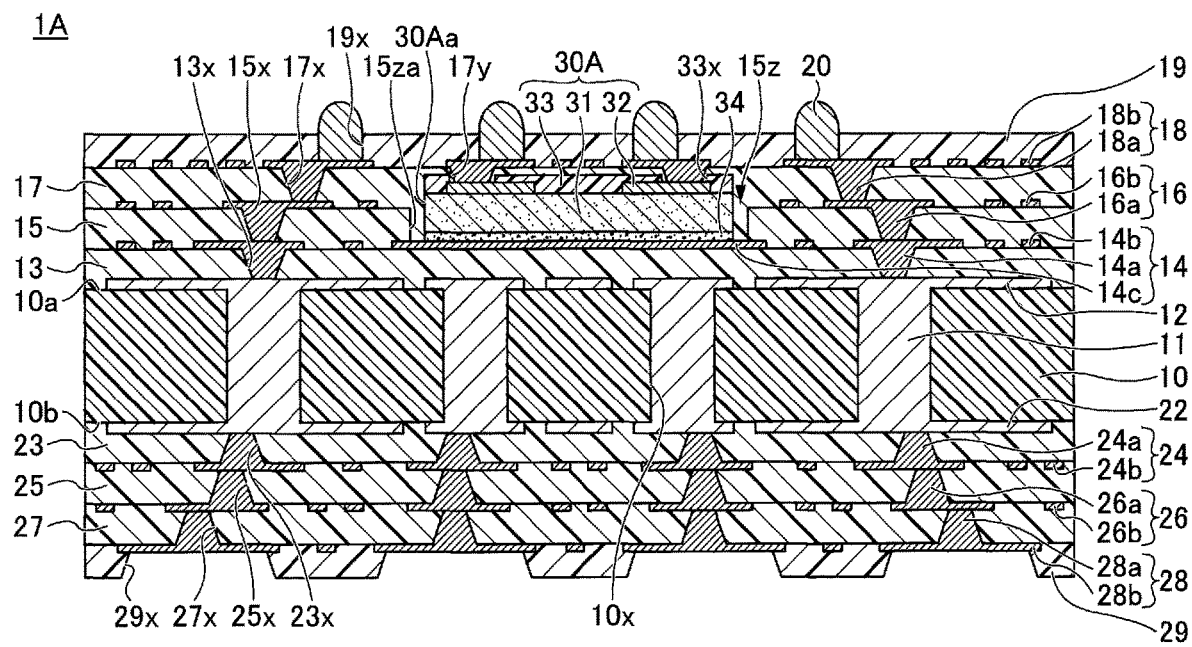
FIGS. 6A and 6B are diagrams illustrating a wiring substrate according to a first variation of the embodiment.
Figure 6B:
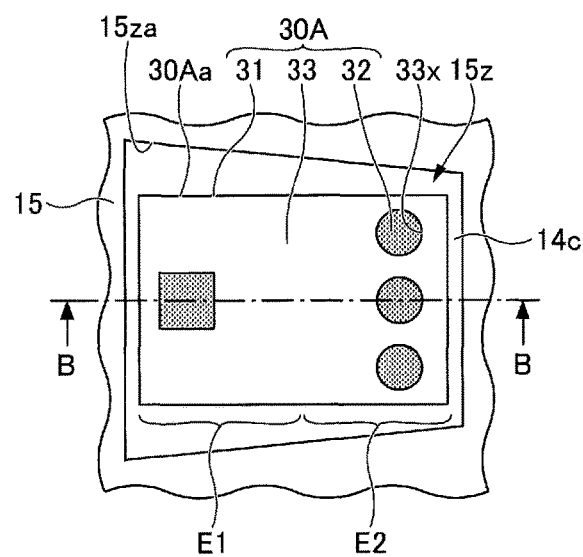

FIG. 6A is a sectional view of a wiring substrate 1A according to the first variation. FIG. 6B is a plan view of part of the wiring substrate 1A, illustrating the cavity 15z and an electronic component 30A. The section of the cavity 15z, the electronic component 30A, and their vicinity of FIG. 6A is a section taken along the line B-B of FIG. 6B. In FIG. 6B, a graphical representation of a structure over the electronic component 30A (the insulating layer 17, the wiring layer 18, the solder resist layer 19, and the external connection terminals 20) is omitted.

Referring to FIGS. 6A and 6B, the wiring substrate 1A is different from the wiring substrate 1 (see FIGS. 1A and 1B) in that the electronic component 30 is replaced with the electronic component 30A.

The electronic component 30A includes a protective layer 33 so formed on the upper surface of the body 31 as to cover the wiring layer 32. The wiring layer 32 is selectively exposed in openings 33x provided in the protective layer 33. The wiring layer 32 exposed in the openings 33x serves as pads. According to the electronic component 30A, the openings 33x formed in the protective layer 33 and exposing the wiring layer 32 is a recess that may correspond to the recess 39 of the above-described embodiment. According to the electronic component 30A, the volume of the recess is relatively small in the region E1 and relatively large in the region E2.

According to the wiring substrate 1A, the width of the gap between a side surface 30Aa of the electronic component 30A and the inner wall surface 15za of the cavity 15z in a plan view is determined based on the volume distribution of the recess.

Specifically, the cavity 15z is so formed that the gap between the side surface 30Aa of the electronic component 30A and the inner wall surface 15za of the cavity 15z is wider along at least part of the region E1 where the volume of the recess is relatively small than along the region E2 where the volume of the recess is relatively large in a plan view.

This causes a greater amount of molten resin to become the insulating layer 17 to enter the gap between the side surface 30Aa of the electronic component 30A and the inner wall surface 15za of the cavity 15z along the region E1 in the process of forming the insulating layer 17. Therefore, the thickness of the insulating layer 17 on the region E1 is substantially equal to the thickness of the insulating layer 17 on the region E2. In other words, the size of the gap between the side surface 30Aa of the electronic component 30A and the inner wall surface 15za of the cavity 15z is so determined that the thickness of the insulating layer 17 on the region E1 is substantially equal to the thickness of the insulating layer 17 on the region E2.

As a result, the depth of the via holes 17y and the bottom area of the via holes 17y (the area of the wiring layer 32 exposed at the bottom of the via holes 17y) are substantially uniform on the regions E1 and E2. Consequently, the bottom area of the via holes 17y is prevented from being extremely small. Therefore, it is possible to increase the reliability of connection of the wiring pattern 18b and the wiring layer 32 via the via holes 17y.

Furthermore, while the two divisional regions E1 and E2 are compared with respect to the volume of the recess in the case of FIG. 6B, more divisional regions may be compared with respect to the volume of the recess and the width of the gap between the side surface 30Aa of the electronic component 30A and the inner wall surface 15za of the cavity 15z may be determined based on the result of the comparison. According to a process of manufacturing the wiring substrate 1A, in the process of FIGS. 4A and 4B of the embodiment, the electronic component 30A including the protective layer 33 in which the openings 33x are provided is placed in the cavity 15z. Thereafter, in the process of FIG. 5A, the insulating layer 17 is so formed as to cover the electronic component 30A. At this point, a resin forming the insulating layer 17 enters the openings 33x the same as the resin enters the recess 39 in the embodiment. Then, in the process of FIG. 5C, the via holes 17y are formed. The via holes 17y pierce through the insulating layer 17 in the openings 33x. The subsequent process is the same as the processes of FIGS. 5C through 5E.

[Second Variation of Embodiment]

A second variation of the embodiment illustrates cases where a cavity different in planar shape from the cavity 15z of the above-described embodiment is formed and a case where multiple electronic components are installed in a single cavity. In the following description of the second variation, a description of the same elements or components as those of the above-described embodiment may be omitted.

Figure 7A:
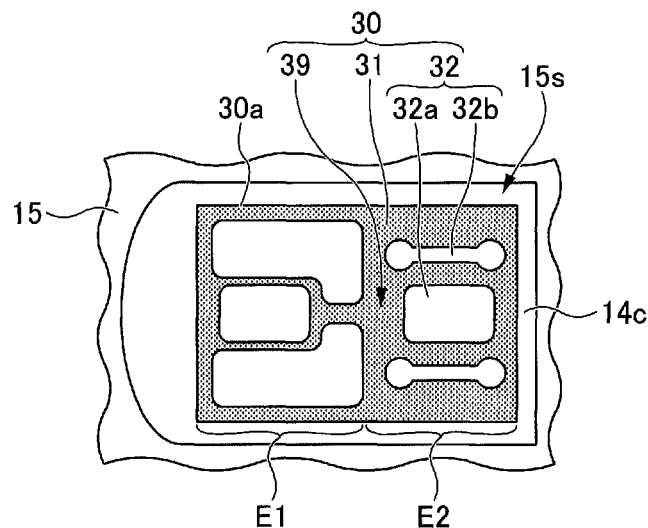
FIGS. 7A through 7C are plan views of part of a wiring substrate, illustrating a cavity and an electronic component, according to a second variation of the embodiment.
Figure 7B:
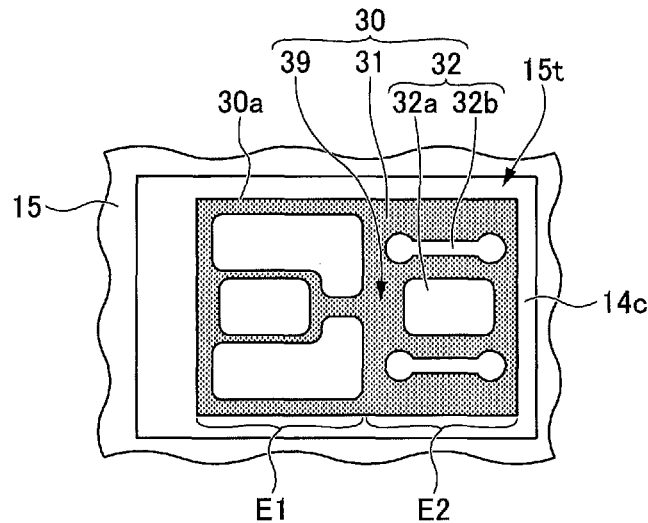
Figure 7C:
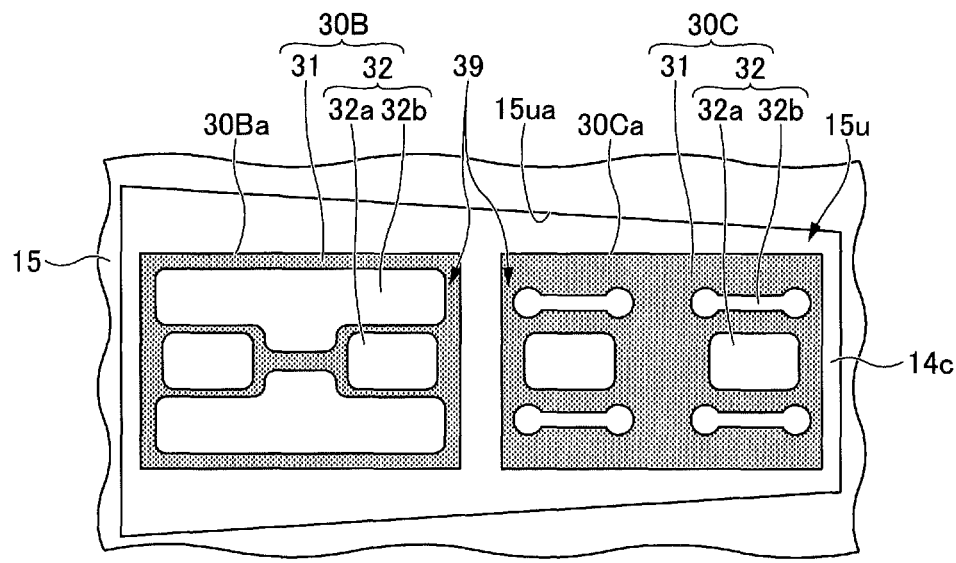

FIGS. 7A through 7C are plan views of part of a wiring substrate according to the second variation, illustrating a cavity and an electronic component, and correspond to FIG. 1B.

To make the thickness of the insulating layer 17 on the region E1 substantially equal to the thickness of the insulating layer 17 on the region E2, the gap between the side surface 30a of the electronic component 30 and the inner wall surface 15za of the cavity 15z may be wider along at least part of the region E1 where the volume of the recess 39 is relatively small than along the region E2 where the volume of the recess 39 is relatively large in a plan view.

Therefore, the planar shape of the cavity 15z is not limited to the shape illustrated in FIG. 1B, and may be a shape such as the shape of a cavity 15s illustrated in FIG. 7A or the shape of a cavity 15t illustrated in FIG. 7B.

The planar shape of the cavity 15s illustrated in FIG. 7A is a shape where one side of a rectangle bulges outward or curves convexly. The curved portion of the cavity 15s faces the side of the electronic component 30 that bounds only the region E1. The distance between the curved portion of the cavity 15s and the side of the electronic component 30 that bounds only the region E1 is greater than the distance between the other three sides of the cavity 15s and the other three sides of the electronic component 30 that face the other three sides of the cavity 15s.

The planar shape of a cavity 15t illustrated in FIG. 7B is rectangular. The distance between the side of the electronic component 30 that bounds only the region E1 and a side of the cavity 15t that faces the side of the electronic component 30 is greater than the distance between the other three sides of the cavity 15t and the other three sides of the electronic component 30 that face the other three sides of the cavity 15t.

The cavity 15z may have a more complicated planar shape as long as the gap between the side surface 30a of the electronic component 30 and the inner wall surface 15za of the cavity 15z is wider along at least part of the region E1 where the volume of the recess 39 is relatively small than along the region E2 where the volume of the recess 39 is relatively large in a plan view.

The point is that the planar shape of the cavity 15z is not limited as long as the width of the gap between the side surface 30a of the electronic component 30 and the inner wall surface 15za of the cavity 15z in a plan view is determined based on the volume distribution of the recess 39.

Furthermore, as illustrated in FIG. 7C, multiple electronic components may be installed in a cavity 15u. In this case, for example, an electronic component 30B is an electronic component where the volume of the recess in the outermost layer is relatively small and an electronic component 30C is an electronic component where the volume of the recess in the outermost layer is relatively large. The cavity 15u is so formed that at least part of the gap between a side surface 30Ba of the electronic component 30B in which the volume of the recess 39 is relatively small and an inner wall surface 15ua of the cavity 15u is wider than the gap between a side surface 30Ca of the electronic component 30C in which the volume of the recess 39 is relatively large and the inner wall surface 15ua of the cavity 15u in a plan view. The cavity 15u may be replaced with the cavity 15s illustrated in FIG. 7A or the cavity 15t illustrated in FIG. 7B.

This causes a greater amount of molten resin to become the insulating layer 17 to enter the gap between the side surface 30Ba of the electronic component 30B and the inner wall surface 15ua of the cavity 15u in the process of forming the insulating layer 17. Therefore, the thickness of the insulating layer 17 on the electronic component 30B is substantially equal to the thickness of the insulating layer 17 on the electronic component 30C. In other words, the size of the gap between the side surfaces 30Ba and 30Ca of the electronic components 30B and 30C and the inner wall surface 15ua of the cavity 15u is so determined that the thickness of the insulating layer 17 on the electronic component 30B is substantially equal to the thickness of the insulating layer 17 on the electronic component 30C.

As a result, the depth of the via holes 17y and the bottom area of the via holes 17y (the area of the wiring layer 32 exposed at the bottom of the via holes 17y) are substantially uniform on the electronic components 30B and 30C. Consequently, the bottom area of the via holes 17y is prevented from being extremely small. Therefore, it is possible to increase the reliability of connection of the wiring pattern 18b and the wiring layer 32 via the via holes 17y.

FIG. 7C illustrates a case where two electronic components are installed in the cavity 15u, while three or more electronic components may be installed in the cavity 15u. Furthermore, electronic components that are different in size may be installed in the cavity 15u.

[Application of Embodiment]

An application of the embodiment is a semiconductor package in which a semiconductor chip is mounted on a wiring substrate according to the embodiment. In the following description of the application, a description of the same elements or components as those of the above-described embodiment may be omitted.

Figure 8:
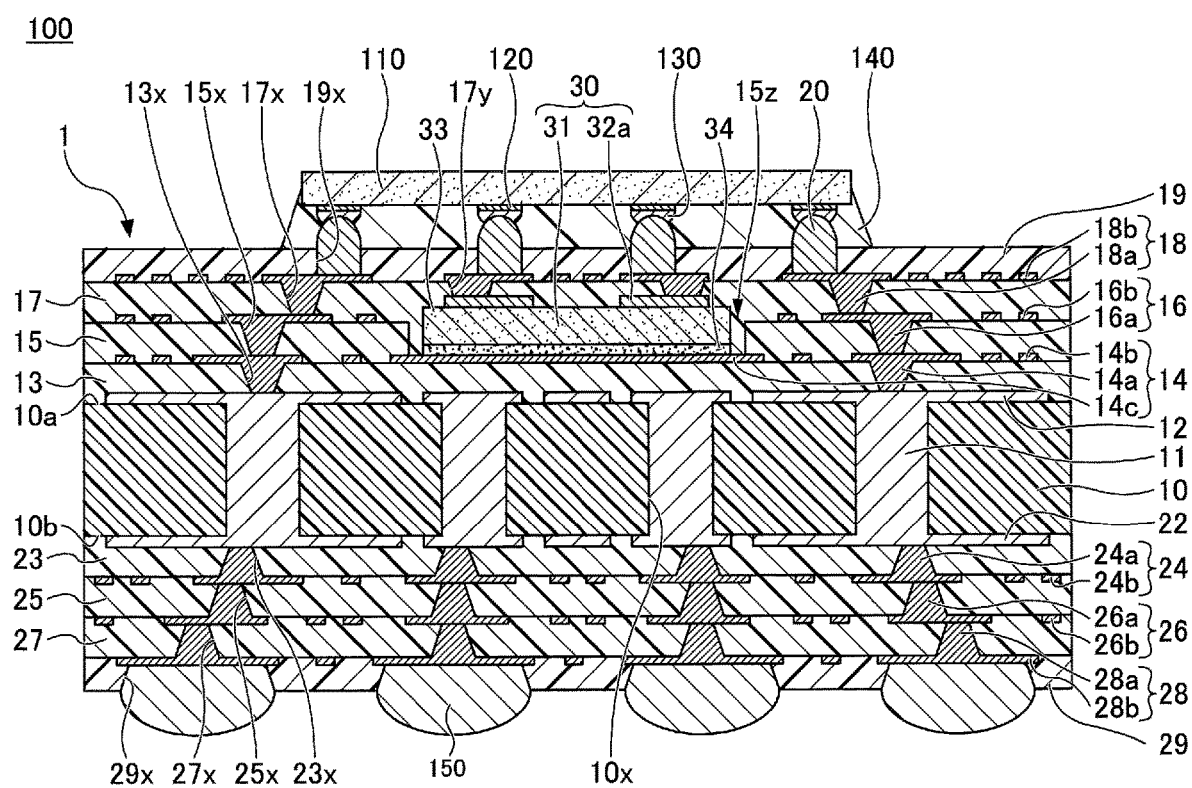
FIG. 8 is a sectional view of a semiconductor package according to an application of the embodiment.

FIG. 8 is a sectional view of a semiconductor package 100 according to the application. Referring to FIG. 8, the semiconductor package 100 includes the wiring substrate 1 illustrated in FIGS. 1A and 1B, a semiconductor chip 110, electrode pads 120, bumps 130, an underfill resin 140, and bumps 150.

The semiconductor chip 110 includes, for example, a thinned semiconductor substrate of, for example, silicon (not depicted) and a semiconductor integrated circuit (not depicted) formed on the semiconductor substrate. The electrode pads 120 electrically connected to the semiconductor integrated circuit are formed on the semiconductor substrate.

The bumps 130 are formed on the electrode pads 120 formed on the semiconductor chip 110 to be electrically connected to the external connection terminals 20 of the wiring substrate 1. The underfill resin 140 fills in a gap between the semiconductor chip 110 and the upper surface of the wiring substrate 1. The bumps 150 are formed on the lower surface of the wiring layer 28 exposed at the bottom of the openings 29x of the solder resist layer 29. The bumps 150 are connected to, for example, a motherboard. The bumps 130 and 150 are, for example, solder bumps. Suitable materials for solder bumps include, for example, alloys containing Pb, Sn—Cu alloys, Sn—Ag alloys, and Sn—Ag—Cu alloys.

Thus, by mounting a semiconductor chip on a wiring substrate according to the above-described embodiment, it is possible to achieve a semiconductor package. The wiring substrate 1 may be replaced with the wiring substrate 1A.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, while the above-described embodiment illustrates the case of applying the present invention to a wiring substrate with a core layer manufactured by a build-up process, the present invention may also be applied to a coreless wiring substrate manufactured by a build-up process. Furthermore, the present invention is not limited to these, and may be applied to various wiring substrates.

Various aspects of the subject-matter described herein may be set out non-exhaustively in the following numbered clause:

1. A method of manufacturing a wiring substrate, the method including:
    forming a cavity in a first insulating layer;
    installing an electronic component in the cavity; and
    forming a second insulating layer on the first insulating layer such that the second insulating layer covers the electronic component,
    wherein a recess having a predetermined volume distribution is formed in an outermost layer of the electronic component, the outermost layer defining a surface of the electronic component facing away from a bottom of the cavity,
    wherein a width of a gap between a side surface of the electronic component and an inner wall surface of the cavity in a plan view is determined based on the predetermined volume distribution, and
    wherein forming the second insulating layer includes
    placing a resin to become the second insulating layer on the first insulating layer such that the resin covers the electronic component; and
    causing the resin to enter the recess and the gap.

What is claimed is:

1. A wiring substrate comprising:
    a first insulating layer including a cavity;
    an electronic component in the cavity; and
    a second insulating layer on the first insulating layer, the second insulating layer covering the electronic component,
    wherein a recess having a predetermined volume distribution is formed in an outermost layer of the electronic component, the outermost layer defining a surface of the electronic component facing away from a bottom of the cavity,
    wherein a width of a gap between a side surface of the electronic component and an inner wall surface of the cavity as viewed in a direction normal to the surface of the electronic component changes according to the predetermined volume distribution, and
    the second insulating layer is in the recess and the gap.

2. The wiring substrate as claimed in claim 1, wherein
the outermost layer includes a first region and a second region,
a volume of the recess is smaller in the first region than in the second region, and
the gap is wider along at least a part of the first region than along the second region as viewed in said direction.

3. The wiring substrate as claimed in claim 1, wherein
the electronic component includes a plurality of electronic components, the plurality of electronic components including a first electronic component and a second electronic component,
the recess includes a first recess formed in an outermost layer of the first electronic component and a second recess formed in an outermost layer of the second electronic component, and a volume of the first recess is smaller than a volume of the second recess, and
a first gap is formed between a side surface of the first electronic component and the inner wall surface of the cavity, a second gap is formed between a side surface of the second electronic component and the inner wall surface of the cavity, and at least a part of the first gap is wider than the second gap as viewed in said direction.

4. The wiring substrate as claimed in claim 1, wherein
the outermost layer includes a wiring layer, and
the recess is a portion of the outermost layer in which the wiring layer is absent.

5. The wiring substrate as claimed in claim 1, wherein
the outermost layer is a protective layer covering a wiring layer, and
the recess is an opening formed in the protective layer and exposing the wiring layer.

* * * * *